(12) United States Patent
Martin et al.

(10) Patent No.: US 7,200,022 B2
(45) Date of Patent: Apr. 3, 2007

(54) APPARATUS AND METHOD FOR MOUNTING MICROELECTRONIC DEVICES ON A MIRRORED BOARD ASSEMBLY

(75) Inventors: Chris G. Martin, Boise, ID (US); Brent Keeth, Boise, ID (US); Brian Johnson, Boise, ID (US); Walter L. Moden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 10/910,980

(22) Filed: Aug. 3, 2004

(65) Prior Publication Data

US 2005/0007807 A1 Jan. 13, 2005

Related U.S. Application Data

(62) Division of application No. 10/273,869, filed on Oct. 17, 2002, now Pat. No. 6,876,562.

(51) Int. Cl.
*G11C 5/06* (2006.01)

(52) U.S. Cl. .......................... 365/63; 365/51; 257/686; 257/723; 257/724; 257/777

(58) Field of Classification Search ............. 365/63 O, 365/51 X; 257/686 X, 723 X, 724 X, 777 X
See application file for complete search history.

(56) References Cited

U.S. PATENT DOCUMENTS

| 5,895,887 | A | 4/1999 | Takata et al. ............... 174/52.4 |
| 6,307,769 | B1 | 10/2001 | Nuxoll et al. ................. 365/63 |
| 6,369,447 | B2 | 4/2002 | Mori .......................... 257/777 |
| 6,433,422 | B1 | 8/2002 | Yamasaki .................... 257/725 |
| 6,625,048 | B2 | 9/2003 | Adedifard ..................... 365/51 |
| 6,667,895 | B2 | 12/2003 | Jang et al. .................... 365/63 |
| 2003/0038350 | A1 | 2/2003 | Hirose ........................ 257/681 |

FOREIGN PATENT DOCUMENTS

JP 06302644 A 10/1994

*Primary Examiner*—Van Thu Nguyen
(74) *Attorney, Agent, or Firm*—Dorsey & Whitney, LLP

(57) ABSTRACT

The present invention is directed to a system, a module, and an apparatus and method for forming a microelectronic memory device. In one embodiment, a system includes a processor and a controller coupled to the processor with at least one memory module coupled to the controller, the module including a pair of memory devices oppositely positioned on respective surfaces of a substrate and interconnected by members extending through the substrate that couple terminals of the devices, the terminals being selected to include a group of terminals that are configured to communicate functionally compatible signals.

21 Claims, 8 Drawing Sheets

| MIRROR TERMINAL | SIGNAL LINE | |
| LOGIC STATE | 94 | 96 |
| --- | --- | --- |
| 0 | 84 | 88 |
| 1 | 88 | 84 |

APPARATUS AND METHOD FOR MOUNTING MICROELECTRONIC DEVICES ON A MIRRORED BOARD ASSEMBLY

CROSS-REFERENCE TO RELATED APPLICATION

This application is a divisional of U.S. patent application Ser. No. 10/273,869, filed Oct. 17, 2002 now U.S. Pat. No. 6,876,562.

TECHNICAL FIELD

The present invention relates to an apparatus and method of forming a microelectronic memory device. More particularly, the invention is directed to a memory device for use in microelectronic memory modules using mirrored circuit boards.

BACKGROUND OF THE INVENTION

Memory modules, or "multichip modules" have become a popular method for packaging memory in computer systems, since the module can provide significantly higher memory density than is currently available from a single memory device. The multichip module generally consists of a plurality of individual memory devices of a uniform design that are supported on an interconnecting substrate such as a printed wire board (PWB). Although the multichip module may have all of the memory devices positioned on a single side of the PWB, "mirrored board" multichip modules that have memory devices positioned on both sides of a PWB are preferred, since the mirrored board module advantageously permits the available surface area of the PWB to be more fully utilized.

FIG. 1 is a block diagram of a computer system 10 according to the prior art, which includes one or more multichip memory modules, as previously described. Briefly, and in general terms, the system 10 includes a processing unit 12 capable of performing general-purpose arithmetic, logic and control functions. The processing unit 12 is coupled to a memory controller 16 that receives memory requests from the processor 12, which may include a memory command, such as a read command, as well as an address that designates the location from which data and/or instructions are to be read. The memory controller 16 uses the command and address to generate appropriate command signals as well as row and column signals. The memory controller 16 is coupled to one or more multichip modules 14 through an interconnecting bus 18, which generally includes one or more control lines 11 that permit the exchange of control signals between the memory controller 16 and the modules 14. The bus 18 also generally includes one or more data lines 13 to provide a data path between the memory controller 16 and the modules 14. One or more address lines 15 are similarly present in the bus 18 that permit the source, or destination of data transmitted on the bus 18 to be designated.

Turning now to FIG. 2, a block diagram of a memory device 22 according to the prior art is shown, that comprises a portion of the memory capacity in the one or more multichip modules 14, as shown in FIG. 1. The device 22 is generally configured to store information in an array format. Accordingly, the device 22 is adapted to accept row and column address signals A0–A11 at address terminals 23 to permit the identification of an individual storage location within the device 22. The device 22 is further configured to exchange data signals DQ0–DQ16 with the system 10 (as shown in FIG. 1) at data terminals 25 subsequent to the identification of the storage location. A plurality of control signals may also be transferred to the device 22 from the system 10 (as shown in FIG. 1) at control signal terminals 26 to control the operation of the device 22. For example, a clock signal (CLK), a row address strobe signal (RAS), a column address strobe signal (CAS), a write-enable signal (WE), a chip select signal (CS), and a chip enable signal (CE) are examples of control signals that are commonly transferred to the device 22 to properly order the operation of the device 22. In addition, various power inputs, which generally include a voltage input and a ground connection, may be coupled to the device 22 at power input terminals 27.

Still referring to FIG. 2, a portion of the signals coupled to the device 22 are generally functionally interchangeable, because the signals provide compatible information and/or data to the device 22. For example, row address signals may be strobed into the device 22 responsive to the RAS signal, and column address signals may similarly be strobed into the device 22 responsive to the CAS signal, to specify a particular memory location within the device. If the row address signals or the column address signals are interchanged, so that the row address signals are latched by the CAS signal and the column address signals are latched by the RAS signals, the device remains functional (although a different memory location is specified) because the row and column address signals are functionally compatible. The data input/output signals 25 are similarly functionally compatible, and may be interchanged in an analogous manner. In contrast, other signals coupled to the device 22 do not exhibit the foregoing functional compatibility. The control signals 26 may not, in general, be interchanged. For example, if the RAS signal is interchanged with the CAS signal, the device 22 would be rendered inoperative, since the RAS and the CAS signals are not functionally compatible. Moreover, if either the RAS or the CAS signals is interchanged with the CL signal, for example, the device 22 would similarly be rendered inoperative.

FIG. 3 is a partial plan view of a mirrored board multichip module 14 for the system 10 according to the prior art. The module 14 generally includes a plurality of memory devices 22 positioned on opposing sides of a PWB 30 that are interconnected by a plurality of traces 32 formed on the opposing surfaces of the PWB 30 for clarity of illustration, only a portion of the plurality of traces 32 are shown in FIG. 3. The traces 32 may be also be formed in an interior portion of the PWB 30. The PWB 30 further includes a edge connector 34 that extends along a portion of an edge of the PWB 30 that allows at least a portion of the traces 32 to be coupled to the bus 18, as shown in FIG. 1.

FIG. 4 is a partial cross sectional view of the mirrored board multichip module 14 according to the prior art viewed at a location indicated by section 4—4 of FIG. 3. As previously described, the module 14 includes a plurality of memory devices 22 positioned on opposing sides of the PWB 30 that may be interconnected to cooperatively form the module 14. Accordingly, the module 14 generally includes a plurality of interconnecting portions 36 that permit connection terminals 35 that carry compatible signals to be electrically interconnected. Since the devices 22 are generally substantially identical, the interconnecting portion 36 generally includes an extension length 38 that extends along a portion of the PWB 30 in order to electrically interconnect the connection terminals 35.

One disadvantage present in the prior art mirrored board multichip module 14 is that the extension length 38 as shown in FIG. 4 increases the overall length of the signal path. Thus, when the system 10 (as shown in FIG. 1) operates at elevated frequencies, the additional signal path length presented by the extension length 38 may adversely affect the overall performance of the module 14. For example, signal delays introduced by the additional extension length 38 may degrade the performance of the module 14, and thereby affect the performance of the entire system 10. Still further, the extension length 38 may introduce parasitic inductances and/or capacitances that may cause an impedance mismatch to occur between the device 22 and other portions of the system 10, that may cause a signal transmitted along a signal path containing the extension length 38 to be partially reflected. In particular, the short rise times associated with digital signals may further exacerbate this problem.

One prior art approach is to package the memory devices in reversed image pairs, so that the connection members of the respective memory devices are mirror images. Consequently, when the memory devices are positioned on opposing surfaces of the PWB, the connection members of the respective memory devices memory are substantially opposed, so that the extension 38 of the interconnecting portion 36 may be eliminated, thus allowing signal-compatible terminals of the device to connect by vias that extend through the PWB. An example of a memory device having the foregoing reversed image characteristics are the M5M410092BFP and M5M410092BRF memory devices, manufactured by the Mitsubishi Electric and Electronics, Inc. of Sunnyvale, Calif.

Although the foregoing reversed image memory devices permit the devices to be interconnected when positioned on opposing surfaces of a PWB, a disadvantage of this approach is that virtually identical memory devices must be packaged in different packages, which generally increases inventory requirements and production costs, so that the overall cost associated with the fabrication of the memory module is adversely affected.

Accordingly, there is a need in the art for a memory device that may be positioned on either surface of a mirrored board memory module without substantially increasing the length of the interconnecting portions that couple signal-compatible terminals of the devices. Further, there is a need in the art for a device that may be readily configured so that the memory device may be positioned on either surface of a mirrored board memory module without incurring additional signal path lengths to the module that may degrade the performance on the opposing surfaces of the PWB.

SUMMARY OF THE INVENTION

The present invention is directed to a system, a module, and an apparatus and method for forming a microelectronic memory device. In an aspect, the system includes a processor and a controller coupled to the processor with at least one memory module coupled to the controller, the module including a pair of memory devices oppositely positioned on respective surfaces of a substrate and interconnected by members extending through the substrate that couple terminals of the devices, the terminals being selected to include a group of terminals that are configured to communicate functionally compatible signals.

DETAILED DESCRIPTION OF THE INVENTION

The present invention relates to an apparatus and method of forming a microelectronic memory device, and more particularly, to a package for use in microelectronic memory modules using mirrored circuit boards. Many of the specific details of certain embodiments of the invention are set forth in the following description and in FIGS. 5 through 10 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimensions, and that specific or relative physical dimensions, if stated, are not to be considered limiting unless the claims expressly state otherwise. Further, where descriptive terminology such as terminals, connectors, pins and the like are used, such descriptive terminology is understood to relate to locations where signals are coupled to the memory device.

Figure 5:
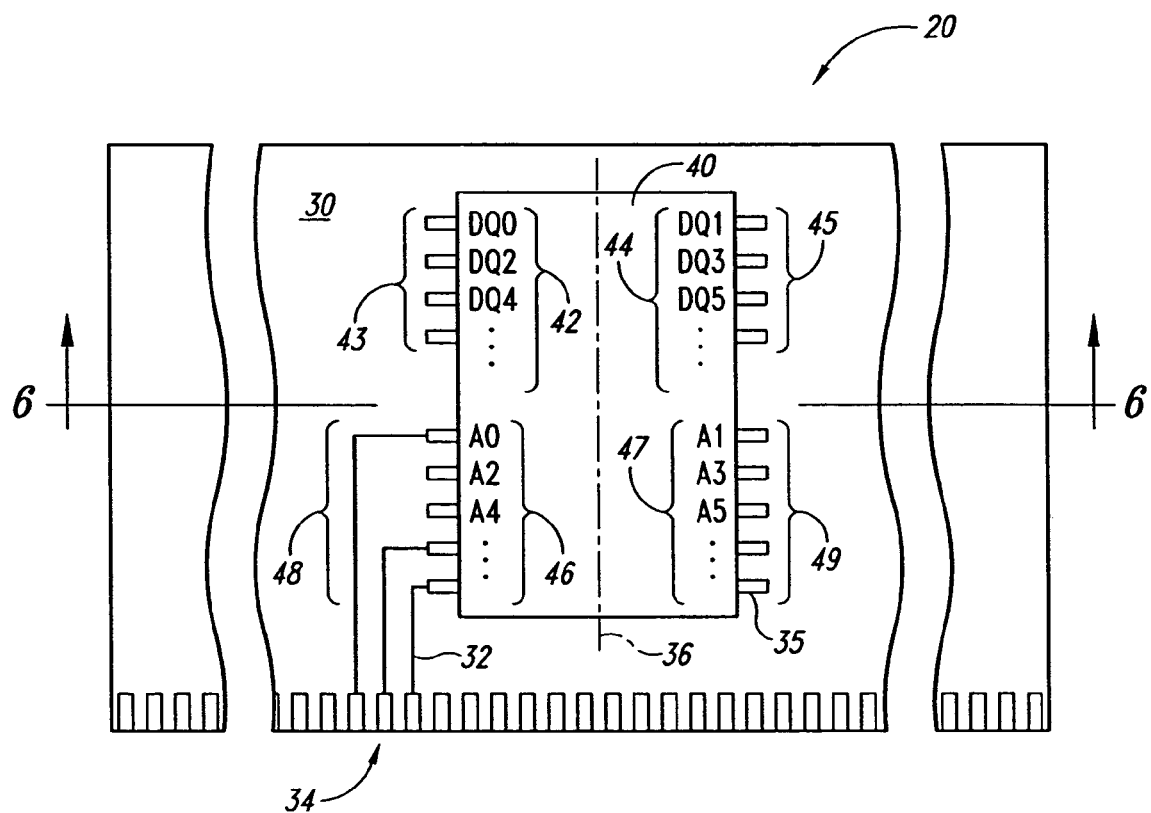
FIG. 5 is a partial plan view of a memory module according to an embodiment of the invention.

FIG. 5 is a partial plan view of a mirrored board multichip module 20 according to an embodiment of the invention. The module 20 includes a pair of memory devices 40 that are supported on a PWB 30. For clarity of illustration, only a single memory device 40 is shown on a side of the module 20. It is understood, however, that the module 20 includes another memory device 40 positioned on an opposing side of the module 20. Moreover, it is further understood that the module 40 may contain a plurality of devices positioned on both sides of the PWB 30. The memory devices 40 may be arranged and interconnected on the PWB 30 by a plurality of traces 32, a portion of which are shown on the PWB 30. The traces 32 may further extend along a surface of the PWB 30 and connect to a plurality of edge connecting tabs 34 positioned along an edge of the PWB 30.

Figure 1:
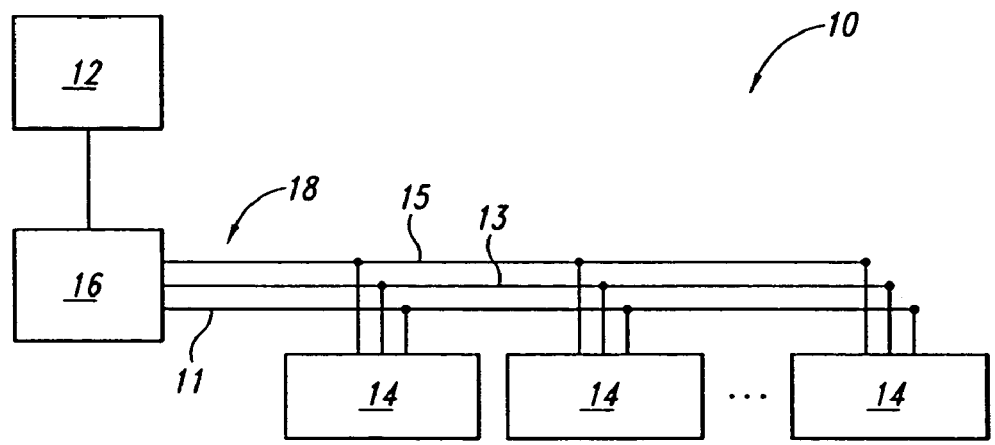
FIG. 1 is a block diagram of a computer system according to the prior art.
Figure 2:
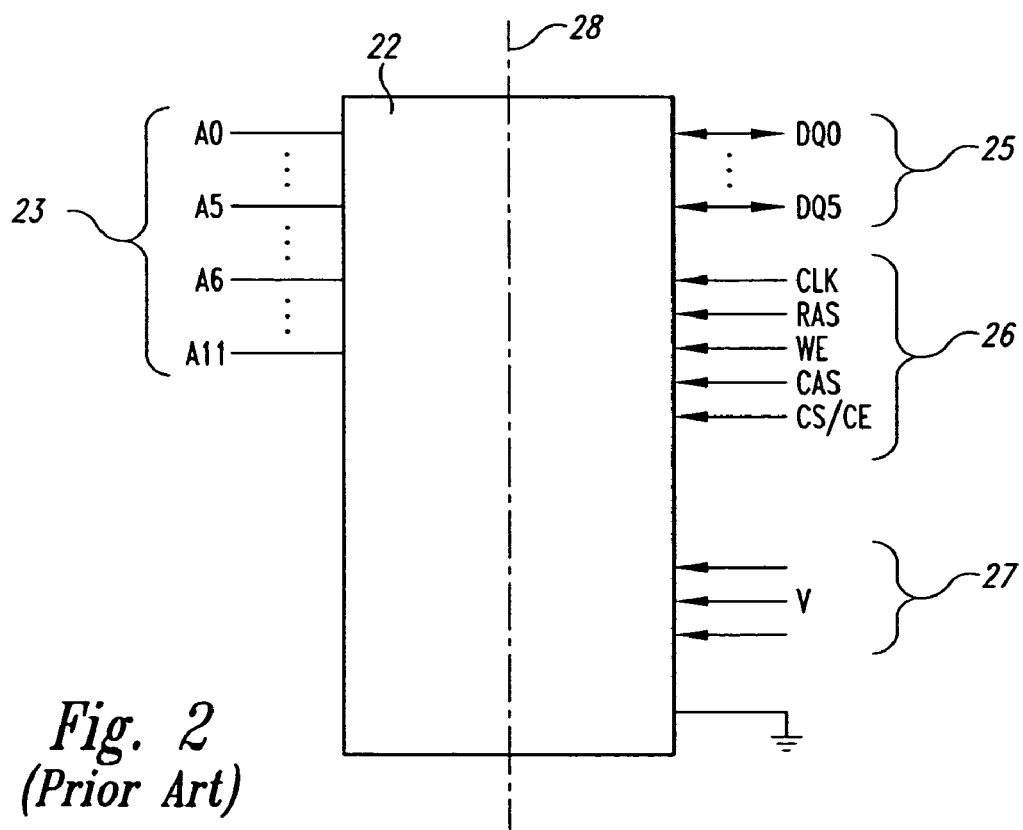
FIG. 2 is a block diagram of a memory device for a computer system according to the prior art.
Figure 3:
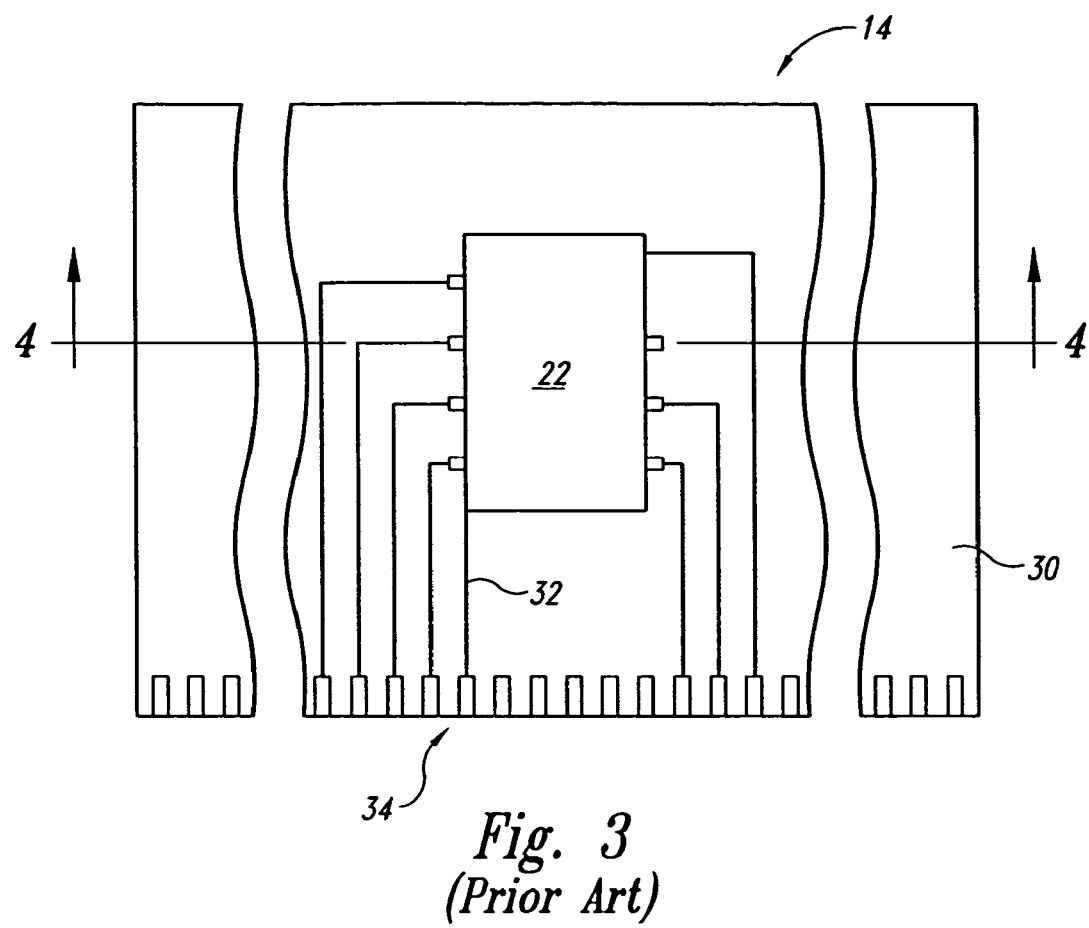
FIG. 3 is a partial plan view of a memory module according to the prior art.
Figure 4:
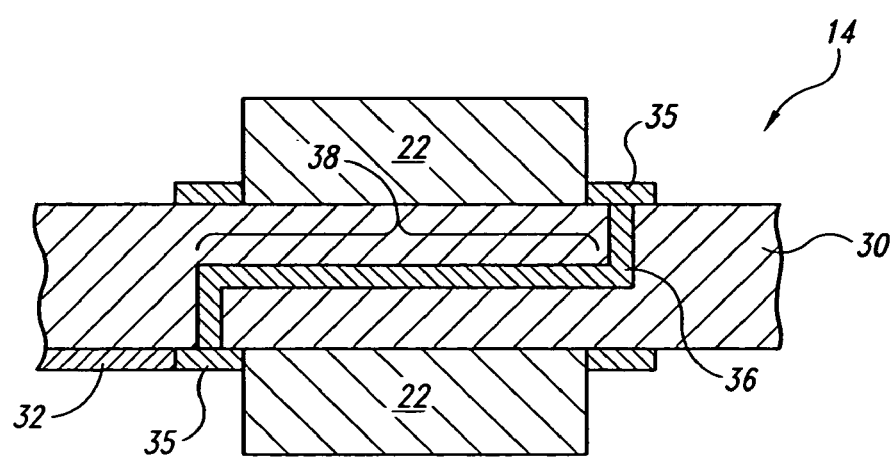
FIG. 4 is a partial cross sectional view of a memory module according to the prior art.

Still referring to FIG. 5, the memory device 40 includes a plurality of terminals 35 coupled to the device 40 that are positioned along exterior edges of the device 40. Although FIG. 5 shows the terminals 35 arranged along opposing edges of the device 40, it is understood that additional terminals 35 may extend from other edges of the device 40, so that the terminals 35 may be positioned along all of the exterior edges of the device 40. In addition, the terminals 35 may be further comprised of terminations suited for use in surface mount methods, such as a ball grid array positioned on a surface of the device 40. The memory device 40 further includes a first data group 42 coupled to a first set of data terminals 43, which are positioned on one edge of the device 40. The first group 42 includes data locations DQ0, DQ2, DQ4, . . . capable of storing data received from other portions of the system 10 (as shown in FIG. 1). A second data group 44 is coupled to a second set of data terminals 45 positioned on an opposing edge of the device 40. The second group 44 includes data locations DQ1, DQ3, DQ5 . . . that are similarly capable of storing data received from other portions of the system 10. The first set of data terminals 43 and the second set of data terminals 45 are generally arranged in opposing positions on the device 40, so that each connector 35 in the first set 43 is generally opposite from a corresponding connector 35 in the second set 45. As previously described, due to signal compatibility, the data locations DQ0, DQ2, DQ4, . . . may generally be interchanged with the data locations DQ1, DQ3, DQ5 . . . so that the first group 42 and the second group 44 may also be interchanged The memory device 40 further includes a first address group 46 coupled to a first set of address terminals 48, and a second address group 47 coupled to a second set of address terminals 49. The first group 46 includes address locations capable of receiving address signals A0, A2, A4 . . . transmitted from other portions of the system 10 (as shown in FIG. 1). The second group 47 includes address locations capable of receiving address signals A1, A3, A5 . . . from other portions of the system 10. The first set of address terminals 48 and the second set of address terminals 49 are also generally arranged in opposing positions on the device 40, so that each connector 35 in the first set 48 is generally opposite from a corresponding connector 35 in the second set 49. Since the signals A0, A2, A4 . . . in the first group 46 and the signals A1, A3, A5 . . . in the second group 47 are also compatible signals, first group 46 and the second group 47 may also be interchanged. The interchangeability of the first data group 42 and the second data group 44, and the first address group 46 and the second address group 47 advantageously allows the memory device 40 to be rotated about a central axis 36 that bisects the device 40 so that the device 40 may be positioned on either side of the PWB 30.

Figure 6:
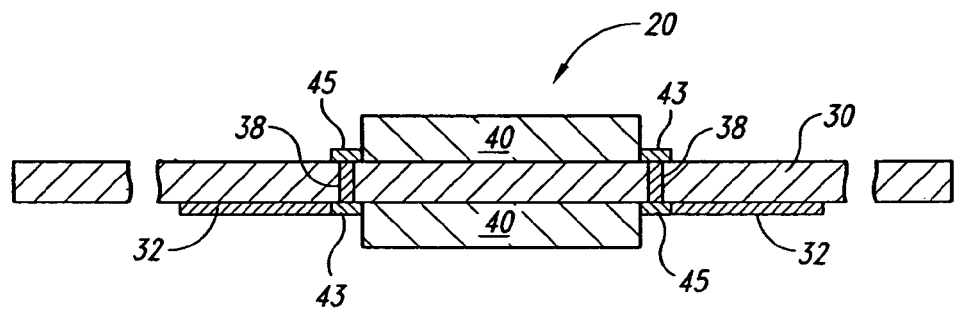
FIG. 6 is a partial cross sectional view of a memory module according to an embodiment of the invention.

FIG. 6 is a partial cross sectional view of the memory module 20 that shows the module 20 along the section 6—6 of FIG. 5. The module 20 includes memory devices 40 positioned on opposing sides of the PWB 30. The devices 40 are coupled to traces 32 that are positioned on one side of the PWB 30, with one of the devices 40 being coupled to the traces 32 by conductive vias 38 that project through the PWB 30. Since the first set of data terminals 43 and the second set of data terminals 45 exchange signals that are generally compatible, the first set 43 and the second set 45 may be directly coupled by vias 38, as shown. Alternatively, the first set 43 and the second set 45 may be coupled by short stubs or by other suitable interconnecting devices. Although FIGS. 5 and 6 show a plurality of conductive terminals 35 extending from the device 40 that couple with conductive traces 32 on the PWB 30, it is understood that other methods may be used to operatively couple the devices 40 to the traces 32. For example, the conductive terminations may include conductive pins that extend outwardly from the device 40. Alternatively, various surface mounting methods may be used to form the conductive connectors, wherein a ball grid array is applied to a side of the device 40, which may then be joined to the PWB 30 by thermally fusing conductive portions of the ball grid array to corresponding bond pads positioned on a surface of the PWB 30.

The foregoing embodiment advantageously permits the single memory device 40 to be positioned on a PWB 30 and interconnected to another memory device 40 positioned on an opposing side of the PWB 30 so that the interconnecting length between the interconnected devices is minimized. The present embodiment thus avoids the difficulties inherent in extended interconnection lengths and/or interconnection lengths of dissimilar length, thus permitting generally higher data access speeds for the module while reducing the presence of parasitic reactances. Further, the present embodiment avoids altogether the difficulties associated with the packaging of memory devices in reversed image pairs, as earlier described.

Figure 7:
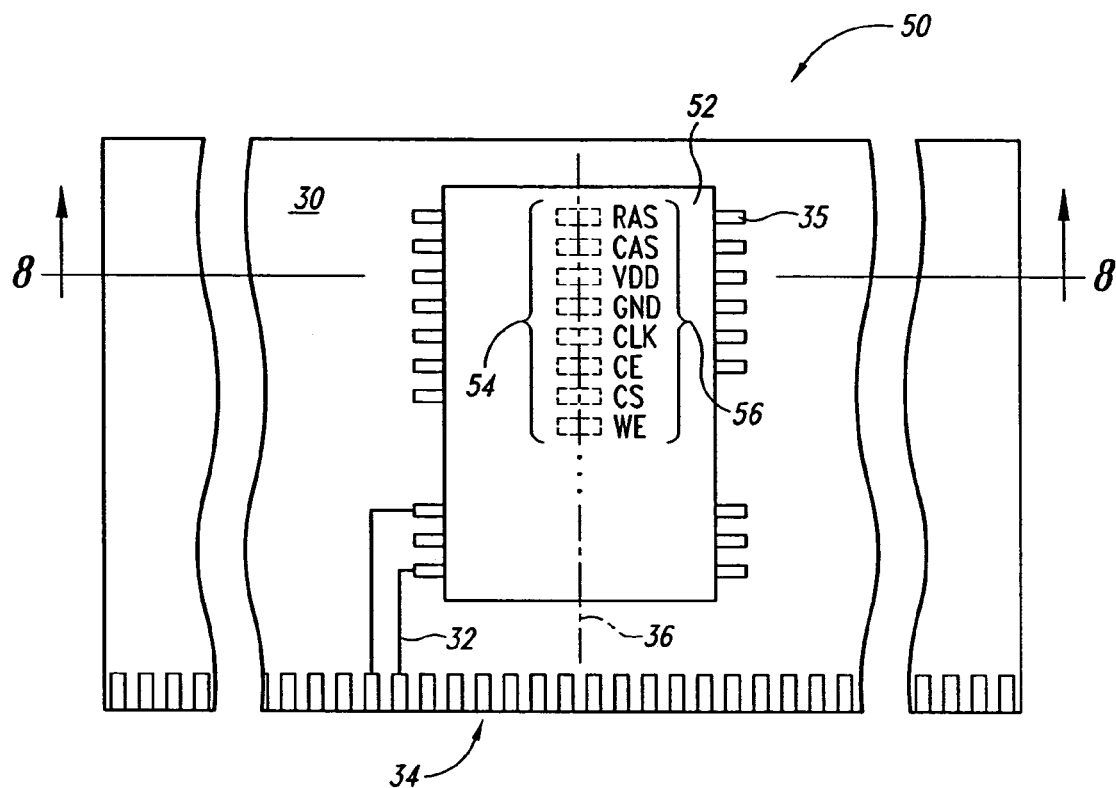
FIG. 7 is a partial plan view of a memory module according to another embodiment of the invention.

FIG. 7 is a partial plan view of a mirrored board multichip module 50 according to another embodiment of the invention. The module 50 includes a pair of memory devices 52 that are supported on a PWB 30. Again, for clarity of illustration, only a single memory device 52 is shown positioned on a side of the module 50, although it is understood that the module 50 includes another device 52 positioned on an opposing side of the PWB 30. The memory device 52 includes a set of contact pads 54 that are positioned on the device 52 substantially along the central axis 36 of the device 52. The set of pads 54 are coupled to a corresponding set of bond pads (not shown in FIG. 7) positioned on the PWB 30 that communicate signals 56 to the device 52. The signals 56 are generally selected from the group of signals communicated to the device 52 that are generally not capable of being readily interchanged, as earlier described. Accordingly, the signals 56 may include RAS and CAS signals for row and column selection, respectively, CL signals for timing, among others. In addition, power connections $V_{DD}$ and GND may also be positioned along the central axis 36. Thus, by positioning the contact pads 54 along the central axis 36 as shown, the device 52 may be interchangeably positioned on either side of the PWB 30.

Figure 8:
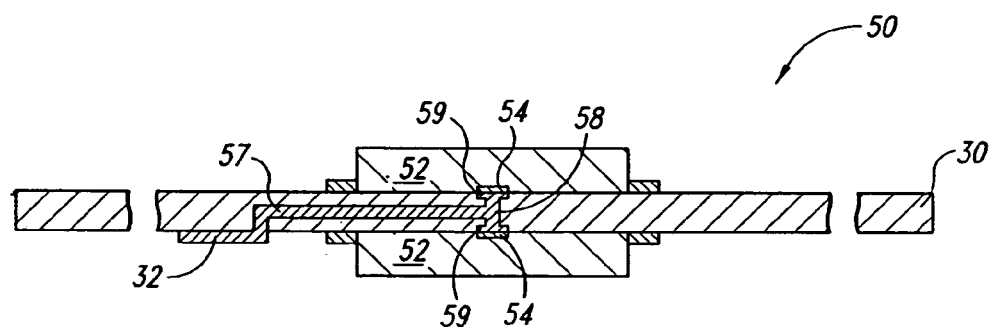
FIG. 8 is a partial cross sectional view of a memory module according to another embodiment of the invention.

FIG. 8 is a partial cross sectional view of the memory module 50 that shows the module 50 along the section 8—8 of FIG. 7. The module 50 includes memory devices 52 positioned on opposing sides of the PWB 30 so that the pads 54 may be coupled to the bond pads 59 positioned on the PWB 30. The bond pads 59 are further coupled to conductive vias 58 that extend through the PWB 30 to couple the contact pads 54 of each of the devices 52. The bond pads 59 are further coupled to traces 32 extending across a surface of the PWB 30 by conductive portions 57 that extend between the vias 58 and the traces 32. In a particular embodiment, the contact pads 54 include a ball grid array that may be coupled to bond pads suitably positioned on the PWB 30, according to a well-known surface mount method.

The foregoing embodiment advantageously permits the device 52 to be positioned on either side of the PWB 30, while substantially reducing the need for extended and/or dissimilar connecting lengths. Additionally, since the contact pads 54 are positioned on a side of the device 52 and along a central axis 36 of the device, the foregoing embodiment may be conveniently incorporated into a variety of surface mount packages.

Figure 9:
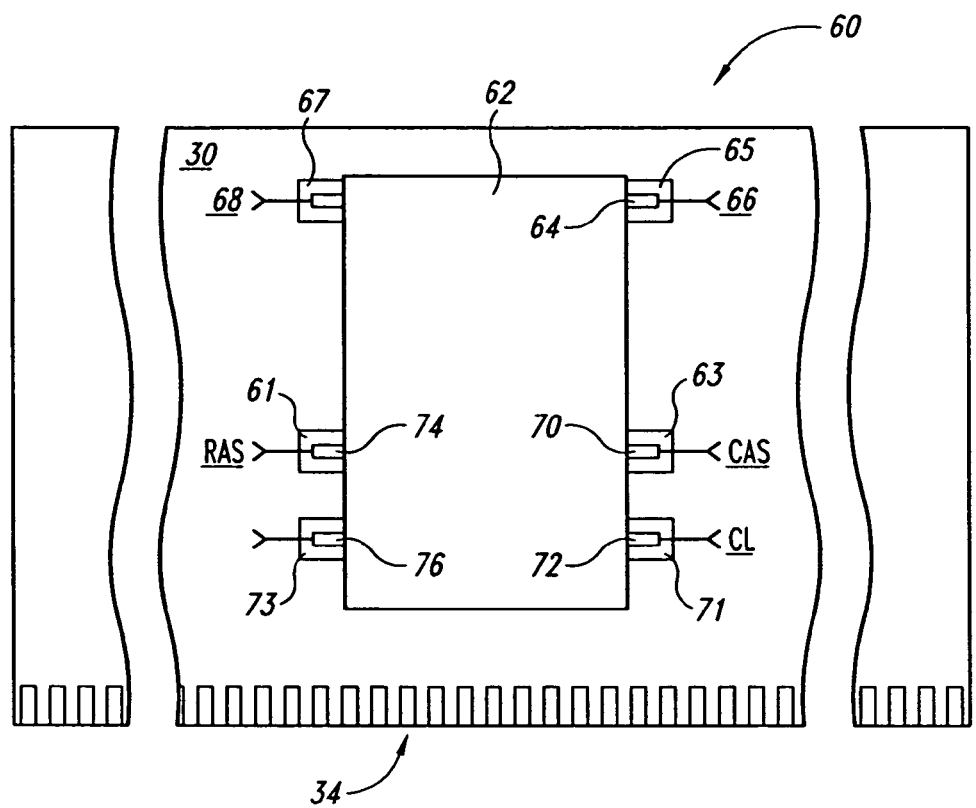
FIG. 9 is a partial plan view of a memory module according to still another embodiment of the invention.

FIG. 9 is a partial plan view of a mirrored board multichip module 60 according to still another embodiment of the invention. The module 60 includes a pair of memory devices 62 positioned on opposing sides of a PWB 30. The memory devices 62 include mirror connectors 64 that permit at least a portion of the terminals coupled to the device 62 to be selectively reconfigured, so that the reconfigured terminals may be coupled to a first signal source when configured in a first configuration, and coupled to a second signal source different from the first signal source when the device 62 is configured in a second configuration. The mirror connector 64 permits the selective reconfiguration of terminals by coupling the mirror connector 64 to a signal source 66 through a bond pad 65 positioned on a surface of the PWB 30. The signal source 66 corresponds to a selected logic state, so that the selected terminals are reconfigured based upon the logic state. For example, and referring still to FIG. 9, the signal source 66 may be the power supply voltage $V_{DD}$ for the device 62, so that a high logic level is obtained at the mirror connector 64. When the high logic state is indicated, a selected connector 74 is enabled to receive RAS signals from the system 10 (as shown in FIG. 1) through a bond pad 61, while another selected connector 70 is enabled to receive CAS signals through a bond pad 63. Still other terminals coupled to the device 62 may also be enabled to receive other selected signals by specifying a logic state at the mirror connector 64. For instance, connector 72 may be enabled to receive CL signals through a bond pad 71 while a high logic state is maintained at the mirror connector 64.

Figure 10:
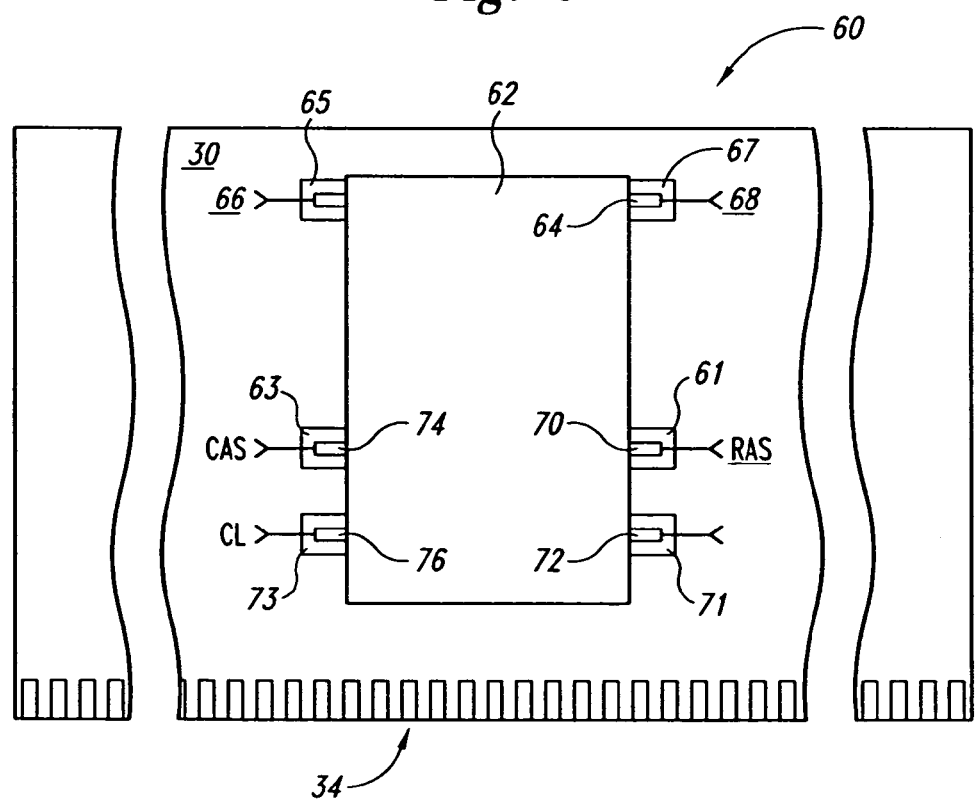
FIG. 10 is a partial plan view of a memory module according to still another embodiment of the invention.

FIG. 10 is a partial plan view of the module 60 that shows the device 62 positioned on an opposing side of the PWB 30. The mirror connector 64 of the device 62 is coupled to a signal source 68 through the bond pad 67. The signal source 68 is different from the signal source 66 so that a different logic state is attained at the mirror connector 64. For example, the signal source 68 may be a ground connection for the device 62, such as a power supply ground $V_{SS}$ so that a low logic state is obtained. When the logic level is low, the connector 74 is enabled to receive CAS signals through the bond pad 63, while the connector 70 is enabled to receive RAS signals through the bond pad 61. Thus, the selected terminals 70 and 74 have been reconfigured to accept signals from incompatible signal sources by a change in the logic state at the mirror connector 64. Similarly, the connector 76 is enabled to receive CL signals through the bond pad 73 by altering the logic state at the mirror connector 64. Although the signal sources 66 and 68 have been described as a prescribed voltage levels, the signal sources 66 and 68 may also correspond to sources that couple opposing electrical polarities to the mirror connector 64. Still further, the signal sources 66 and 68 may be sources capable of transmitting a digital signal of predetermined form to the mirror connector 64 to develop a desired logic state at the mirror connector 64. Although the foregoing discussion has described the use of a single mirror connector 64 to reconfigure a pair of selected terminals 70 and 74, it is understood that the device 62 may have more than a single mirror connector, and that other mirror connectors may be employed to reconfigure various other terminals associated with the device 62. Furthermore, it is understood that a single mirror connector may also be employed to reconfigure more than a single pair of selected connectors.

Figures 11, 12:
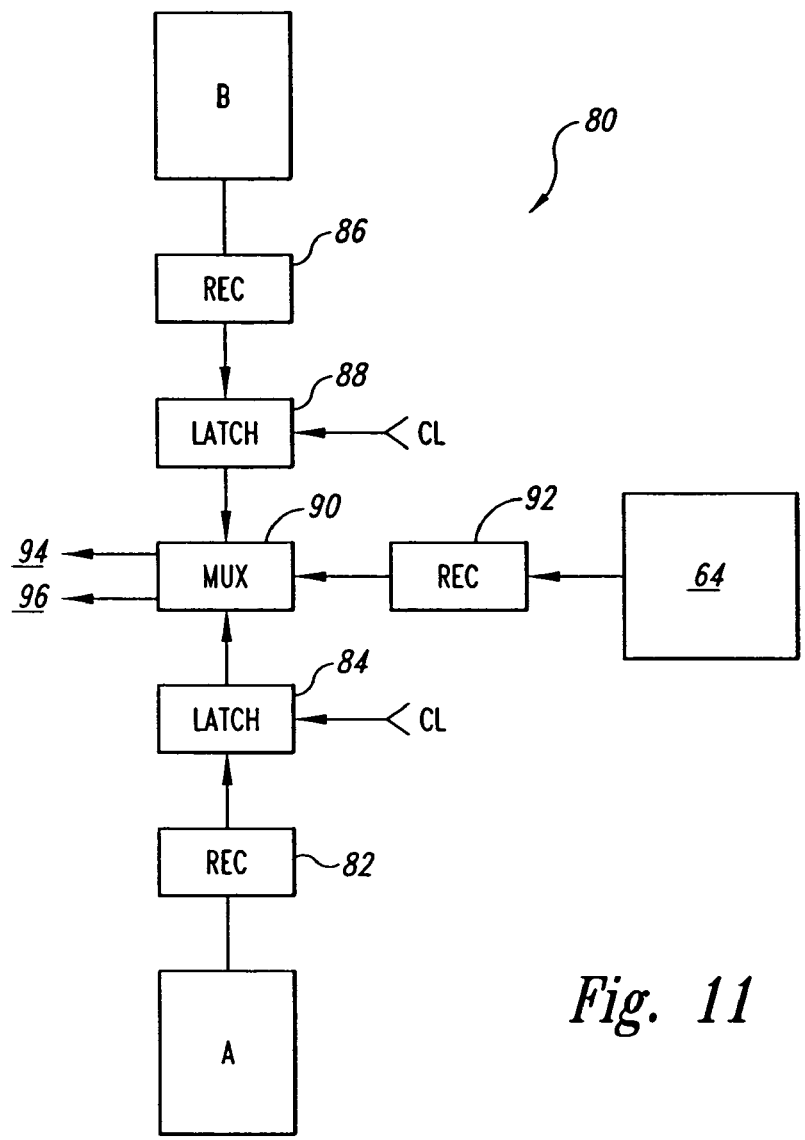
FIG. 11 is a block diagram of an apparatus for selectively reconfiguring terminals on a memory device according to still another embodiment of the invention.
FIG. 12 is a logic table for an apparatus for selectively reconfiguring terminals on a memory device according to still another embodiment of the invention.

FIG. 11 is a block diagram of an apparatus 80 for selectively reconfiguring terminals on the memory device 62 of FIGS. 9 and 10, according to still another embodiment of the invention. The apparatus 80 includes at least a pair of terminals A and B each respectively coupled to receivers 82 and 86 that are configured to receive signals communicated to the terminals A and B from signal sources (not shown) coupled to the terminals A and B. The receiver 82 is further coupled to a latching circuit 84 that is configured to latch a signal received from the receiver 82 in response to a clock signal CL. The receiver 86 is similarly coupled to a latching circuit 88 that is configured to latch a signal received from the receiver 86 in response to a clock signal CL. The latching circuit 84 and the latching circuit 88 are further coupled to a multiplexer 90. The multiplexer 90 is also coupled to the mirror terminal 64 through a receiver 92, and is further capable of providing output signals to the device 62 (as shown in FIGS. 9 and 10) through output lines 94 and 96 in response to a logic level communicated to the multiplexer 90 from the receiver 92. The mirror terminal 64, as previously discussed, is configured to be coupled to a signal source (not shown) that represents a selected logic state.

With reference now also to FIG. 12, which shows a logic table for the multiplexer 90, the operation of the apparatus 80 will be described in greater detail. When a signal that represents a desired logic state is coupled to the mirror terminal 64, the logic state is communicated to the multiplexer 90. For example, and with reference to FIG. 12, when the selected logic state corresponds to "0", the signal latched at latching circuit 84 will be coupled to the output line 94, while the signal latched at latching circuit 88 will be coupled to the output line 96. If the selected logic state corresponds to "1", however, the signal latched at latching circuit 88 will be coupled to the output line 94, while the signal latched at latching circuit 84 will be coupled to the output line 96.

Figure 13:
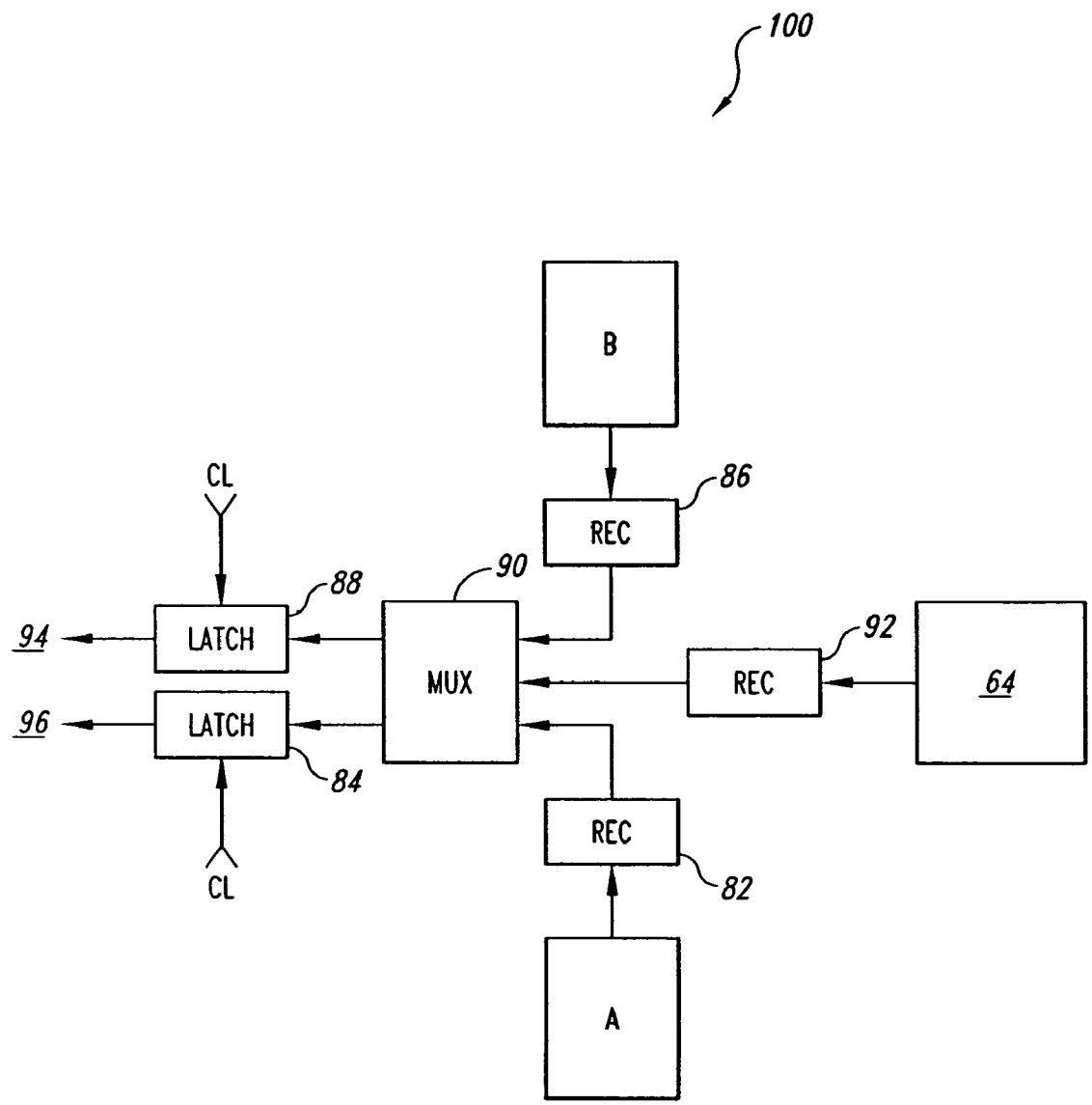
FIG. 13 is a block diagram of an apparatus for selectively reconfiguring terminals on a memory device according to yet another embodiment of the invention.

FIG. 13 is a block diagram of an apparatus 100 for selectively reconfiguring terminals on the memory device 62 of FIGS. 9 and 10, according to yet another embodiment of the invention. The apparatus 100 includes at least a pair of terminals A and B each respectively coupled to receivers 82 and 86 that are configured to receive signals communicated to the terminals A and B from signal sources (not shown) coupled to the terminals A and B. The receiver 82 and the receiver 86 are further coupled to the multiplexer 90. The multiplexer 90 is further coupled to the device through a latching circuit 84 and a latching circuit 88 that are coupled to the device 62 through the output lines 96 and 94, respectively. The latching circuits 84 and 88 are configured to latch signals received from the multiplexer 90 in response to clock signals CL. The mirror terminal 64, as previously discussed, is configured to be coupled to a signal source (not shown) that represents a selected logic state. Accordingly, when a signal that represents a desired logic state is coupled to the mirror terminal 64, the logic state is communicated to the multiplexer 90 to configure the apparatus 100, as shown in FIG. 12.

Figure 14:
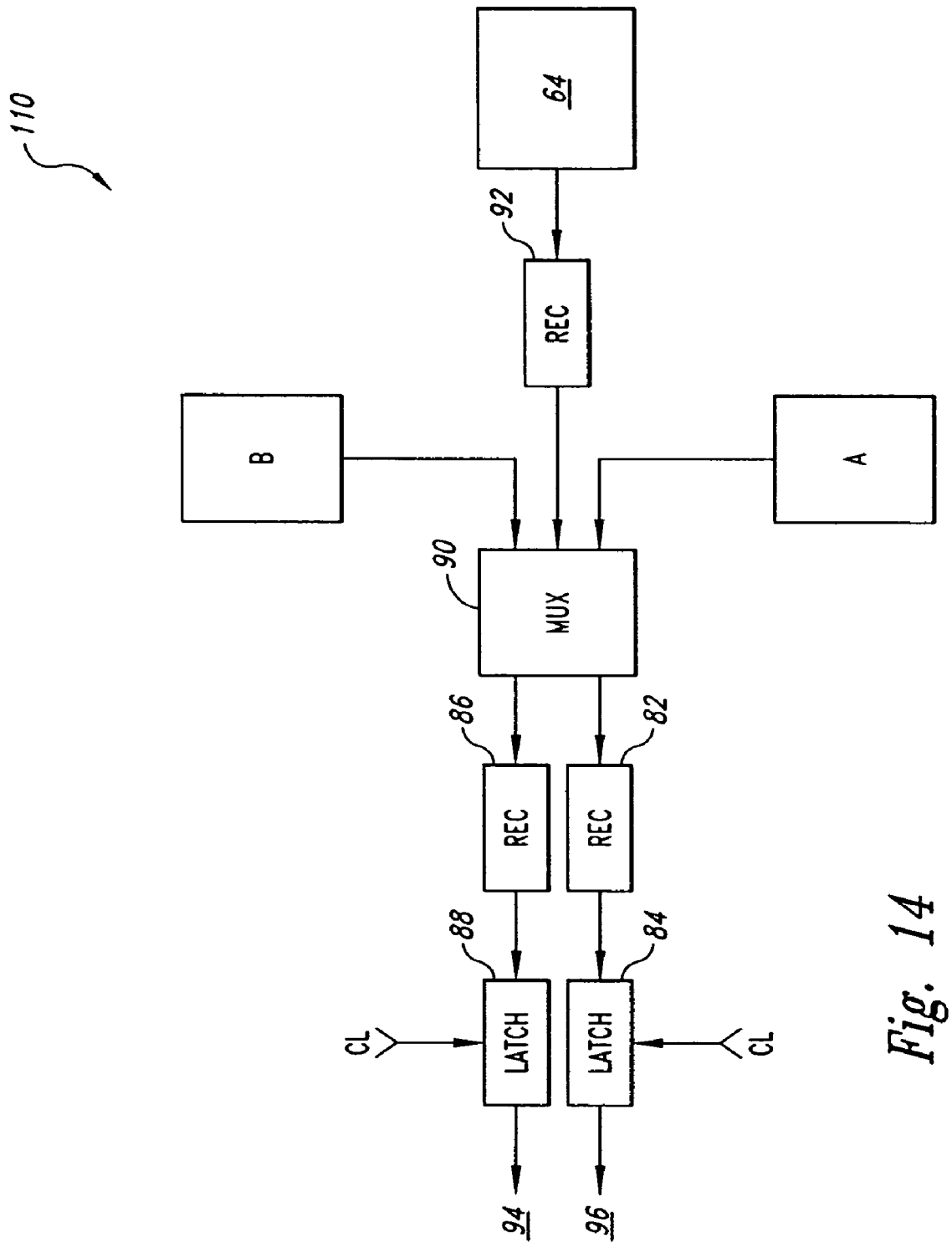
FIG. 14 is a block diagram of an apparatus for selectively reconfiguring terminals on a memory device according to still yet another embodiment of the invention.

FIG. 14 is a block diagram of an apparatus 110 for selectively reconfiguring terminals on the memory device 62 of FIGS. 9 and 10, according to still yet another embodiment of the invention. As in the previous embodiments, the apparatus 110 includes at least a pair of terminals A and B each coupled to the multiplexer 90. The multiplexer 90 is further coupled to the mirror terminal 64 through the receiver 92. The output line 94 of the device 62 is coupled to the multiplexer 90 through a latching circuit 88 and a receiver 86, and the output line 96 is coupled to the multiplexer 90 through a latching circuit 84 and a receiver 82. The latching circuits 84 and 88 are configured to latch signals received from the receivers 82 and 86 in response to clock signals CL. Again, the mirror terminal 64 is configured to be coupled to a signal source (not shown) that represents a selected logic state. Accordingly, when a signal that represents a desired logic state is coupled to the mirror terminal 64, the logic state is communicated to the multiplexer 90 to configure the apparatus 110, as shown in FIG. 12.

The foregoing embodiments advantageously permit at least a portion of the terminals coupled to the device 62 to be selectively reconfigured, so that the device 62 may be positioned on opposing sides of a PWB 30. Since the reconfiguration of the device 62 occurs when a logic state is detected at the mirror connector 64, the present embodiment may be conveniently incorporated into existing memory devices, with little or no reordering of the connector assignment for the device.

The above description of illustrated embodiments of the invention is not intended to be exhaustive or to limit the invention to the precise form disclosed. While specific embodiments of, and examples of, the invention are described in the foregoing for illustrative purposes, various equivalent modifications are possible within the scope of the invention as those skilled within the relevant art will recognize. Moreover, the various embodiments described above can be combined to provide further embodiments. Accordingly, the invention is not limited by the disclosure, but instead the scope of the invention is to be determined entirely by the following claims.

The invention claimed is:

1. An apparatus for selectively reconfiguring terminals on a memory device, comprising:
   a multiplexer coupled to the device, a first signal source and a second signal source that is different from the first signal source;
   a mirror terminal coupled to the multiplexer through a first receiver, the mirror terminal being selectively coupleable to a logic signal;
   a first terminal coupled to the device and the multiplexer, the multiplexer being operable to couple the first terminal to the first signal source when the mirror terminal is coupled to a first logic signal, the multiplexer being operable to couple the first terminal to the second signal source when the mirror terminal is coupled to a second logic signal; and
   a second terminal coupled to the device and the multiplexer, the multiplexer being operable to couple the second terminal to the second signal source when the mirror terminal is coupled to the first logic signal, the multiplexer being operable to couple the second terminal to the first signal source when the mirror terminal is coupled to the second logic signal.

2. The apparatus of claim 1, wherein the first terminal is coupled to the multiplexer through a second receiver, and the second terminal is coupled to the multiplexer through a third receiver.

3. The apparatus of claim 1, wherein the first terminal is coupled to the multiplexer through a second receiver coupled to a first latching circuit, and the second terminal is coupled to the multiplexer through a third receiver and a second latching circuit.

4. The apparatus of claim 1, wherein the multiplexer is coupled to the device through a first latching circuit and a second latching circuit.

5. The apparatus of claim 1, wherein the multiplexer is coupled to the device through a second receiver coupled to a first latching circuit and a third receiver coupled to a second latching circuit.

6. The apparatus of claim 1, wherein the first logic signal is a first voltage level, and the second logic signal is a second voltage level.

7. The apparatus of claim 6, wherein the first voltage level is a device supply potential, and the second voltage level is a ground potential.

8. An apparatus for selectively reconfiguring terminals on a memory device, comprising:
   a multiplexer coupled to the device, a first signal source and a second signal source that is different from the first signal source;
   a mirror terminal coupled to the multiplexer, the mirror terminal being selectively coupleable to a logic signal;
   a first terminal coupled to the device and the multiplexer through a first receiver and a first latching circuit, the multiplexer being operable to couple the first terminal to the first signal source when the mirror terminal is coupled to a first logic signal, the multiplexer being operable to couple the first terminal to the second signal source when the mirror terminal is coupled to a second logic signal; and
   a second terminal coupled to the device and the multiplexer through a second receiver and a second latching circuit, the multiplexer being operable to couple the second terminal to the second signal source when the mirror terminal is coupled to the first logic signal, the multiplexer being operable to couple the second terminal to the first signal source when the mirror terminal is coupled to the second logic signal.

9. The apparatus of claim 8, wherein the multiplexer is coupled to the device through the first latching circuit and the second latching circuit.

10. The apparatus of claim 8, wherein the multiplexer is coupled to the device through the first receiver coupled to the first latching circuit and the second receiver coupled to the second latching circuit.

11. The apparatus of claim 8, wherein the first logic signal is a first voltage level, and the second logic signal is a second voltage level.

12. The apparatus of claim 8, wherein the first voltage level is a device supply potential, and the second voltage level is a ground potential.

13. An apparatus for selectively reconfiguring terminals on a memory device, comprising:
   a multiplexer coupled to the device, to a first signal source through a first latching circuit, and to a second signal source through a second latching circuit, the first signal source being different from the second signal source;
   a mirror terminal coupled to the multiplexer, the mirror terminal being selectively coupleable to a logic signal;
   a first terminal coupled to the device and the multiplexer, the multiplexer being operable to couple the first terminal to the first signal source when the mirror terminal is coupled to a first logic signal, the multiplexer being operable to couple the first terminal to the second signal source when the mirror terminal is coupled to a second logic signal; and
   a second terminal coupled to the device and the multiplexer, the multiplexer being operable to couple the second terminal to the second signal source when the mirror terminal is coupled to the first logic signal, the multiplexer being operable to couple the second terminal to the first signal source when the mirror terminal is coupled to the second logic signal.

14. The apparatus of claim 13, wherein the first terminal is coupled to the multiplexer through a first receiver, and the second terminal is coupled to the multiplexer through a second receiver.

15. The apparatus of claim 13, wherein the multiplexer is coupled to the device through a first receiver coupled to the first latching circuit and a second receiver coupled to the second latching circuit.

16. The apparatus of claim 13, wherein the first logic signal is a first voltage level, and the second logic signal is a second voltage level.

17. The apparatus of claim 13, wherein the first voltage level is a device supply potential, and the second voltage level is a ground potential.

18. An apparatus for selectively reconfiguring terminals on a memory device, comprising:
   a multiplexer coupled to the device, to a first signal source through a first receiver coupled to a first latching circuit, and to a second signal source through a second receiver coupled to a second latching circuit, the first signal source being different from the second signal source;
   a mirror terminal coupled to the multiplexer, the mirror terminal being selectively coupleable to a logic signal;
   a first terminal coupled to the device and the multiplexer, the multiplexer being operable to couple the first terminal to the first signal source when the mirror terminal is coupled to a first logic signal, the multiplexer being operable to couple the first terminal to the second signal source when the mirror terminal is coupled to a second logic signal; and
   a second terminal coupled to the device and the multiplexer, the multiplexer being operable to couple the second terminal to the second signal source when the mirror terminal is coupled to the first logic signal, the multiplexer being operable to couple the second terminal to the first signal source when the mirror terminal is coupled to the second logic signal.

19. The apparatus of claim 18, wherein the first terminal is coupled to the multiplexer through the first receiver, and the second terminal is coupled to the multiplexer through the second receiver.

20. The apparatus of claim 18, wherein the first logic signal is a first voltage level, and the second logic signal is a second voltage level.

21. The apparatus of claim 18, wherein the first voltage level is a device supply potential, and the second voltage level is a ground potential.

* * * * *